(12) United States Patent
Kawa et al.

(10) Patent No.: US 7,100,142 B2
(45) Date of Patent: Aug. 29, 2006

(54) METHOD AND APPARATUS FOR CREATING A MASK-PROGRAMMABLE ARCHITECTURE FROM STANDARD CELLS

(75) Inventors: Jamil Kawa, Campbell, CA (US); Narendra V. Shenoy, Bangalore (IN); Raul Camposano, Los Altos, CA (US)

(73) Assignee: Synopsys, Inc., Mountain View, CA (US)

( * ) Notice: Subject to any disclaimer, the term of this patent is extended or adjusted under 35 U.S.C. 154(b) by 289 days.

(21) Appl. No.: 10/820,523

(22) Filed: Apr. 7, 2004

(65) Prior Publication Data
US 2005/0229141 A1    Oct. 13, 2005

(51) Int. Cl.
*G06F 17/50* (2006.01)
(52) U.S. Cl. .................. 716/17; 716/18; 716/16; 716/3; 716/2
(58) Field of Classification Search ............ 716/17, 716/18, 16, 3, 2
See application file for complete search history.

(56) References Cited

U.S. PATENT DOCUMENTS

| | | | | |
|---|---|---|---|---|
| 5,526,278 A | * | 6/1996 | Powell | 716/16 |
| 5,752,006 A | * | 5/1998 | Baxter | 703/14 |
| 5,943,488 A | * | 8/1999 | Raza | 716/19 |
| 6,272,668 B1 | * | 8/2001 | Teene | 716/10 |
| 6,601,221 B1 | * | 7/2003 | Fairbanks | 716/5 |
| 6,886,143 B1 | * | 4/2005 | Park | 716/2 |
| 6,938,236 B1 | * | 8/2005 | Park et al. | 716/17 |
| 7,017,131 B1 | * | 3/2006 | Barnes | 716/6 |
| 7,023,744 B1 | * | 4/2006 | Shimanek et al. | 365/189.11 |
| 2002/0133791 A1 | * | 9/2002 | Cohn et al. | 716/4 |
| 2003/0204822 A1 | * | 10/2003 | Whitaker et al. | 716/2 |
| 2004/0143797 A1 | * | 7/2004 | Nguyen et al. | 716/1 |
| 2004/0261052 A1 | * | 12/2004 | Perry et al. | 716/19 |
| 2005/0010889 A1 | * | 1/2005 | Barnes | 716/11 |
| 2005/0034095 A1 | * | 2/2005 | Bansal | 716/18 |
| 2005/0050505 A1 | * | 3/2005 | Bednar et al. | 716/12 |

FOREIGN PATENT DOCUMENTS

| | | | |
|---|---|---|---|
| EP | 905906 A2 | * | 3/1999 |
| JP | 01091525 A | * | 4/1989 |
| JP | 07254019 A | * | 10/1995 |

OTHER PUBLICATIONS

Richards, "Simulation Libraries for System-Level Design", Computer, vol. 28, No. 2, Feb. 1995, pp. 76-77.*

(Continued)

*Primary Examiner*—Phallaka Kik
(74) *Attorney, Agent, or Firm*—Park, Vaughan & Fleming LLP

(57) ABSTRACT

One embodiment of the invention provides a system for creating a mask-programmable module from standard cells. The system operates by first specifying characteristics of an end design and then selecting a plurality of standard cells from a standard cell library based on the characteristics of the end design. Next, the system combines the plurality of standard cells into a mask-programmable module, wherein instances of the mask-programmable module are repeated to form a mask-programmable fabric. The system also designs a mask-programmable interconnect to match the mask-programmable module, whereby connections within the mask-programmable module and between mask-programmable modules can be generated by programming the mask-programmable interconnect.

24 Claims, 6 Drawing Sheets

OTHER PUBLICATIONS

Salcic et al., "SimP: a Core for FPLD-Based Custom-Configurable Processors", 2nd International Conference on ASIC, Oct. 21, 1996, pp. 197-201.*

Guan et al., "ASIC Automatic Layout Generation Using Large Standard Cell Libraries", 2nd International Conference on ASIC, Oct. 21, 1996, pp. 5-8.*

Ahmad et al., "Grouping Variables into Multiport Memories for ASIC Data Synthesis", Proceedings of Fifth Annual IEEE International ASIC Conference and Exhibit, Sep. 21, 1992, pp. 162-165.*

Venkateswaran et al., "Programming Techniques for PA3 Architectures", IEEE International Conference on ICASSP '85, vol. 10, Apr. 1985, pp. 1376-1379.*

* cited by examiner

MASK PROGRAMMABLE FABRIC
400

| MPF CELL 401 | MPF CELL 402 | MPF CELL 403 | MPF CELL 404 |
|---|---|---|---|
| MPF CELL 405 | MPF CELL 406 | MPF CELL 407 | MPF CELL 408 |
| MPF CELL 409 | MPF CELL 410 | MPF CELL 411 | MPF CELL 412 |

METHOD AND APPARATUS FOR CREATING A MASK-PROGRAMMABLE ARCHITECTURE FROM STANDARD CELLS

RELATED APPLICATION

The subject matter of this application is related to the subject matter in a co-pending non-provisional application by the same inventors as the instant application entitled, "Method and Apparatus for Designing an Integrated Circuit Using a Mask-Programmable Fabric," having Ser. No. 10/734,399, and filing date 12 Dec. 2003.

BACKGROUND

1. Field of the Invention

The invention relates to the process of designing an integrated circuit. More specifically, the invention relates to a method and an apparatus for creating a mask-programmable architecture from standard cells for use in creating systems on a chip.

2. Related Art

The dramatic improvements in semiconductor integration densities in recent years have largely been achieved through corresponding improvements in process technologies involved in manufacturing the semiconductor chips. As semiconductor feature sizes continue to decrease, the cost of producing a set of masks used to manufacture a semiconductor chip has increased considerably. For example, industry analysts predict that the cost of generating a set of masks (~30 or more masks are typically required) for a single design in a 90 nm process will exceed one million dollars.

Note that mask re-spins are frequently required to correct logic bugs after first silicon, or to deal with changing requirements. Note that requirements frequently change because over the lifetime of a product; various derivatives of a semiconductor chip are required to accommodate changing formats or interfaces.

In order to avoid costly mask re-spins to deal with changing requirements, many designers use field-programmable gate arrays (FPGAs) to implement portions of a design that are likely to change. In this way, it is possible to make changes to a system by simply reprogramming the FPGA without incurring the cost of an additional mask re-spin.

However, there are a number of problems with using FPGAs. Although FPGAs provide a great amount of flexibility, FPGAs are relatively expensive in terms of area, power and delay. For example, implementing a function using an FPGA can consume up to ten times the area and 500 times the power of a standard cell implementation. Furthermore, FPGAs are typically located off-chip, so a considerable delay is typically involved in communicating with the FPGA.

Some developers have also considered integrating FPGA circuitry into conventional semiconductor chips along with other types of circuitry. However, a number of interconnection issues still remain. The interconnect architecture in an FPGA depends on the underlying technology used to achieve programmability. In the case of anti-fuse based technologies, programmability is achieved by selectively blowing the anti-fuses. Hence, such an architecture is field-programmable only once and requires programming hardware. In the case of SRAM-based FPGA technologies, the routing programmability needs access to active silicon, which gives rise to additional complications.

Designers have also considered using a mask-programmable architecture to facilitate re-spins of only a subset of masks to configure the circuitry (see related co-pending non-provisional application by the same inventors as the instant application entitled, "Method and Apparatus for Designing an Integrated Circuit Using a Mask-Programmable Fabric," having Ser. No. 10/734,399, and filing date 12 Dec. 2003. However, deciding on a basic mask-programmable module to use for a specific family of designs is a tedious process. It requires significant effort from circuit designers and architects to perform various layout, optimization, and characterization operations for the basic mask-programmable module. Generating and characterizing a library using a configurable module requires an effort that is equivalent to that of developing a whole standard cell library.

Hence, what is needed is a method and an apparatus that facilitates developing on a mask-programmable module without the going through the tedious process described above.

SUMMARY

One embodiment of the invention provides a system for creating a mask-programmable module from standard cells. The system operates by first specifying characteristics of an end design and then selecting a plurality of standard cells from a standard cell library based on the characteristics of the end design. Next, the system combines the plurality of standard cells into a mask-programmable module, wherein instances of the mask-programmable module are repeated to form a mask-programmable fabric. The system also designs a mask-programmable interconnect to match the mask-programmable module, whereby connections within the mask-programmable module and between mask-programmable modules can be generated by programming the mask-programmable interconnect.

In a variation on this embodiment, the mask-programmable interconnect can be programmed by changing inter-metal via layers and/or metal layers.

In a variation on this embodiment, combining the plurality of standard cells into a mask-programmable module additionally involves defining connections between standards cells within the mask-programmable module.

In a variation on this embodiment, the system generates views for the mask-programmable module. These views can include: a physical view that specifies connectivity within the mask-programmable module, including connectivity with pins in the mask-programmable module; a logical view that specifies logical relationships between signals in the mask-programmable module; and a timing view that specifies timing relationships within the mask-programmable module.

In a variation on this embodiment, generating the views involves using pre-existing information about the plurality of the standard cells from the standard cell library to generate the views for the mask-programmable module.

In a variation on this embodiment, the system receives a high-level design for an integrated circuit and performing a synthesis operation on the high-level design to generate a netlist for the high-level design that contains references to mask-programmable modules.

In a variation on this embodiment, the system performs a placement operation and a routing operation on the netlist to produce a layout for the integrated circuit In a variation on this embodiment, performing the routing operation involves programming the mask-programmable modules and mask-programmable interconnect.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Design Flow

Figure 1:
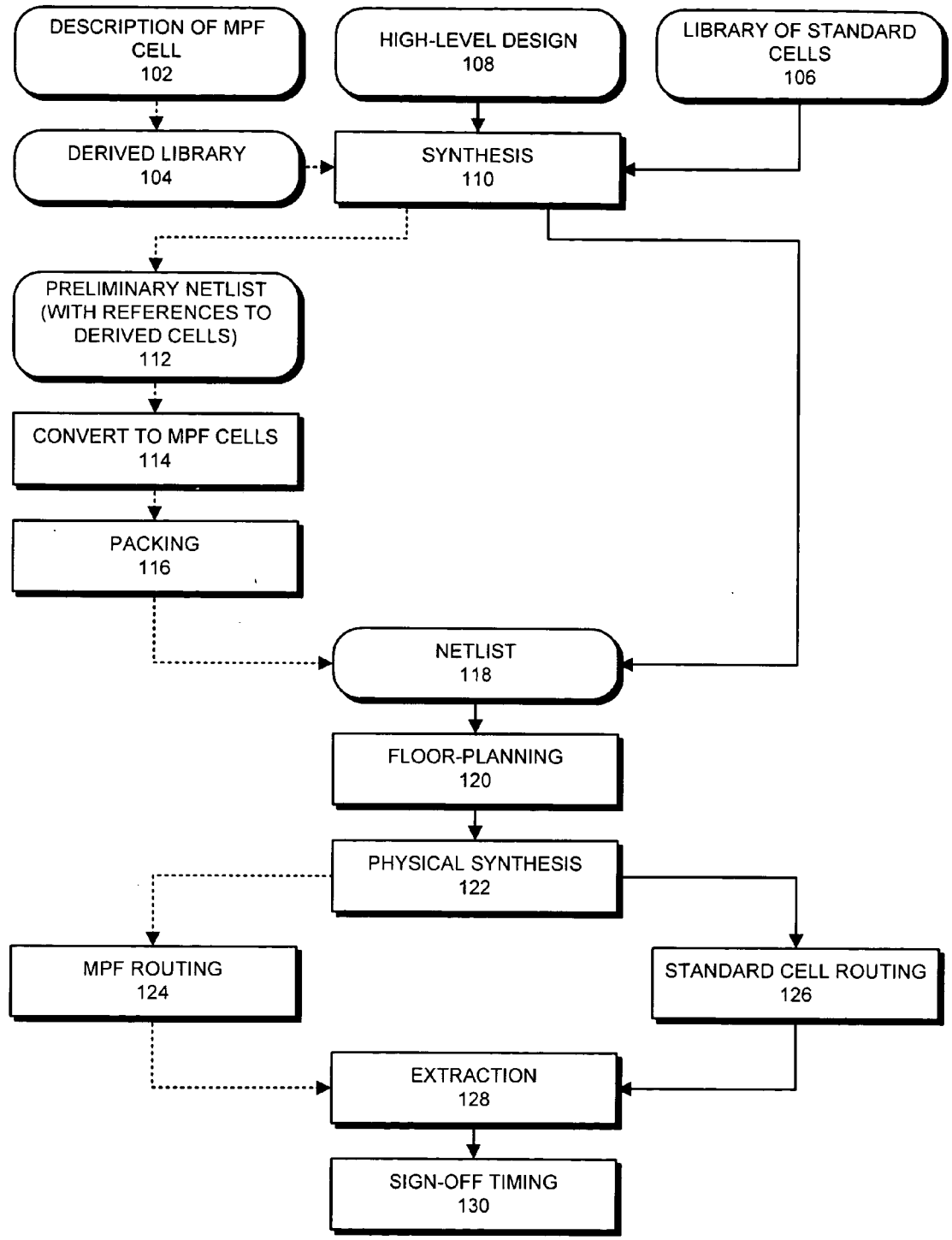
FIG. 1 presents a design flow for both a mask-programmable fabric and a standard cell design in accordance with an embodiment of the invention.

FIG. 1 presents a design flow for both a mask-programmable fabric (MPF) and a standard cell design in accordance with an embodiment of the invention. The standard cell design flow (in a very simplistic view) follows the bold arrows. It starts by creating a library of standard cells and defining their power, delay, physical, and electrical characteristics (step 106). Next, given a high-level design 108 (for example, in a register-transfer level format), the standard cell design flow performs a synthesis operation on the high-level design (step 110) to produce a netlist 118, which references gates from the library of standard cells. Next, the system performs standard floor-planning (step 120), physical synthesis (step 122), and routing (step 126) operations. The system then performs an extraction operation (step 128) for interconnect networks and back-annotates them in a static timing analyzer for analysis. This makes it possible to sign-off on timing for the design (step 130). Note that the above-described process can use industry-standard tools for the standard-cell design flow.

In FIG. 1, the MPF flow follows the dashed arrows wherever possible. Once again we can use industry standard tools for the design flow, except for the MPF portions (where we use a custom tool). Note that we can use a custom language (called the MPF language) to create a description of an MPF cell 102. This language specifies information on the nature of the logic and routing programmability. The MPF flow mimics the standard-cell flow with the following exceptions:

(1) The MPF library contains a description of single MPF cell 102. Using the MPF library and the description of the MPF cell 102, we generate a derived library 104 for synthesis. Cells in the derived library are generated by enumerating logic functions obtained by tying a subset of inputs to power or ground or to each other.

(2) After synthesis, preliminary netlist 112 contains instances from the derived library. We then perform a reverse transformation, which converts each cell in the derived library to an instance of the MPF cell with its inputs appropriately tied (step 114). We also pack the logic to fully utilize unused resources in a cell (step 116). The output of this process becomes part of netlist 118.

(3) Instead of a standard-cell router, which assumes that all metal and via layers are available for realizing physical connections, we use a special MPF router, which performs an MPF routing operation (step 124). This MPF router uses symbolic constraints called connections (between a pair of pins, a pin and metal segment or between a pair of segments) to realize the physical connectivity. This information can be provided in the MPF language.

Note that we can create a baseline implementation flow for a set of designs using standard cells. This baseline implementation defines performance metrics (area, delay, and power dissipation) for the standard cell implementation. Each instance of an MPF cell will result in performance that is inferior to standard cell due to the constraints of mask programmability. Hence, the ratio of performance metric in an MPF library to a standard cell library will be invariably greater than one.

Programmable Fabric Cell Design

There are several aspects to the design of a programmable fabric cell. We consider each of these in a systematic manner in the following sections. We also outline a generic scheme that enables easy routing of the interconnect fabric. While reading the following sections, note there is a tight link between the choices made during cell design and the impact on tools.

Programmable Layers

Deciding on layers that provide programmability is key. It is advantageous to leave the mask layers in the front end of line set untouched. From the back end of line set, we have the metal and via layers available. If we pick layers close to the top, the number of foundry steps that remain to be completed upon re-programming is small. However from a routing perspective, all connections to pins will have to be brought up to the higher programmable layers, which consumes scarce vertical routing resources. Moreover, it renders layers above the MPF implementation unavailable for the rest of the chip. Hence, in one embodiment of the invention, we restrict programmability to the lower layers of metal and vias (metal 2 to metal 5). Note that we selectively leave the lowest metal layer (metal 1) for intra-cell routing. The number of layers that we use depends on the cell design. For example, we can pick via2, via3, and via4 to be the programmable layers for our cell.

Combinational Logic

The nature of programmable combinational logic is important to a specific design. If the design is "rich" in arithmetic operations, it is important to have gates such as 3-input XORs. In such a case, a look-up table serves well. On the other hand, if the design is dominated by control logic, then a multiplexer tree structure that enables complex and-or-invert gates fares better. Hence, in an exemplary embodiment of the invention, we use a multiplexer tree for our cell. Furthermore, note that even other structures, such as universal logic blocks, can be used.

Local Inversions

In a typical design, the ratio of inverters to the total number of gates is at least 10%. Note that implementing an inverter using a large programmable gate is an extremely inefficient use of resource. In a look-up table architecture, a majority of the inversions can be absorbed into the table functions. However, it is not possible to do this for other architectures.

An alternative solution is to use small inverters in the programmable cell that can drive input pins only within the cell. In this way, signal inversion takes place locally where it is needed. In order to implement this solution, we need to determine the number of such inverters needed within a cell. Hence, from a tools perspective, it is desirable to convert individual inverters (after synthesis) into local inverters as much as possible, thereby reducing programmable cell count. This process can be accomplished in the packing step described below. In an exemplary embodiment of an MPF cell, we can assign two local inverters for each combinational logic function in the cell.

Sequential Logic

The nature of sequential MPF elements is to a large extent dictated by the choice of sequential behavior required on a per-design basis. The user decides if a flip-flop with set, reset, and multiplexer-enable signals is required. In addition, the user decides if support for scan test is required. Unlike traditional standard cells, which provide both Q and $\overline{Q}$ signals, it is sometimes advantageous to provide only a Q. This is especially true if local inversion is supported. Also note that each cell output has to be designed with sufficient strength to drive the programmable interconnect fabric. Consequently, the output stages may have larger transistors than typical standard cells. Note that by not providing $\overline{Q}$, we avoid having a large output stage in the cell and can thus save some area.

Ratio of Combinational to Sequential Logic

Sequential content in a design can vary significantly. If the number of sequential elements in a design (compared to the number of combinational gates) is small, having a combinational to sequential ratio of 1:1 in the MPF cell is unfavorable because a large number of sequential elements will be unused. Depending on the design, the user can configure an MPF cell so that the ratio of programmable combinational logic to programmable sequential logic varies from one to three. Software support to take advantage of this is can be provided in the packing step described below.

Another approach is to create an MPF cell that allows the construction of sequential elements from combinational elements in the cell. However, this can lead to sub-optimal delay performance and a significant increase in programmable routing resources.

Programmable Interconnect

It is desirable to design a generic interconnect scheme that enables the router to operate efficiently independent of the decisions made earlier in this section. We next provide a set of guidelines that facilitate such a design.

Programmable Interconnect: Pin Access and Pin Tying

In one embodiment of the invention, all pins are designed to be available on metal 2 as vertical segments that span a few metal 3 tracks on the north and south edges of the cell. This enables access from pins to the interconnect fabric by simply using a via.

Note that since logic programmability is achieved by tying pins to power and ground, it is desirable to achieve this efficiently. Moreover, it is also desirable for unused input pins to be tied. We can solve this problem by dedicating horizontal metal 3 tracks that span all input pins to power and ground. In this way, tying a pin to logic zero (one) involves using a via to connect the pin to the segment on metal 3 that is tied to ground (power).

Figure 2:
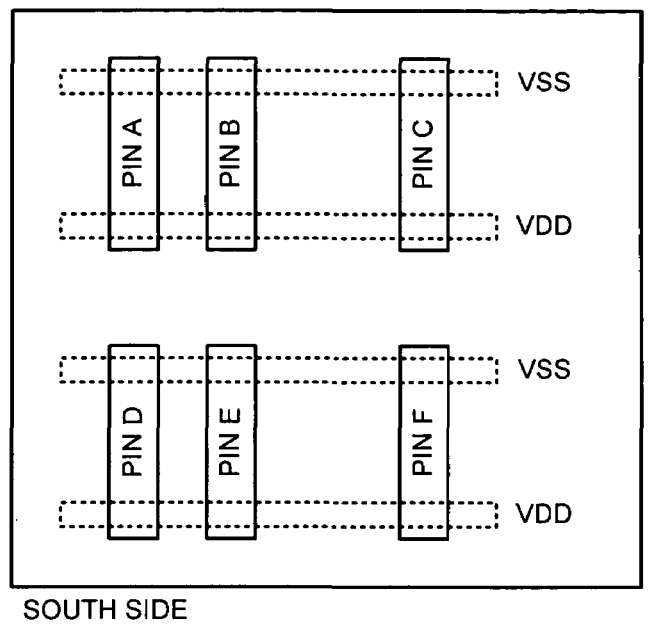
FIG. 2 illustrates how pins are accessed within a mask-programmable cell in accordance with an embodiment of the invention.

FIG. 2 shows six pins, three on the north side and three on the south side of a cell. The dashed lines represent metal 3 tracks. These pins span six metal 3 tracks. Two of them are used to facilitate tying pins to power and ground (VDD and VSS). Note that it is desirable for pins to span sufficiently many tracks (excluding those used for power and ground) to allow all active pins on that side to be connected. Note that active pins include the pins that are not tied to power or ground. In FIG. 2, the number of open tracks spanned is four. Failure to do so can leave pins orphaned during routing, i.e. there is no way to connect to them. Note that during routing, we can use an analysis step called "pin reservation" to detect poor pin access in a design.

Programmable Interconnect: Interconnect Architecture

In one embodiment of the invention, the MPF cell uses a crossbar architecture on metal 3, metal 4, and metal 5 layers. Each metal segment spans the cell (almost) in the preferred direction. Moreover, a segment can couple to metal segments on neighboring layers by means of an appropriate via. Note that an MPF cell can have up to four MPF cells as its neighbors. Since an interconnect fabric is defined within a cell, connectivity with the interconnect in the neighboring cell is also achieved through vias.

Figure 3:
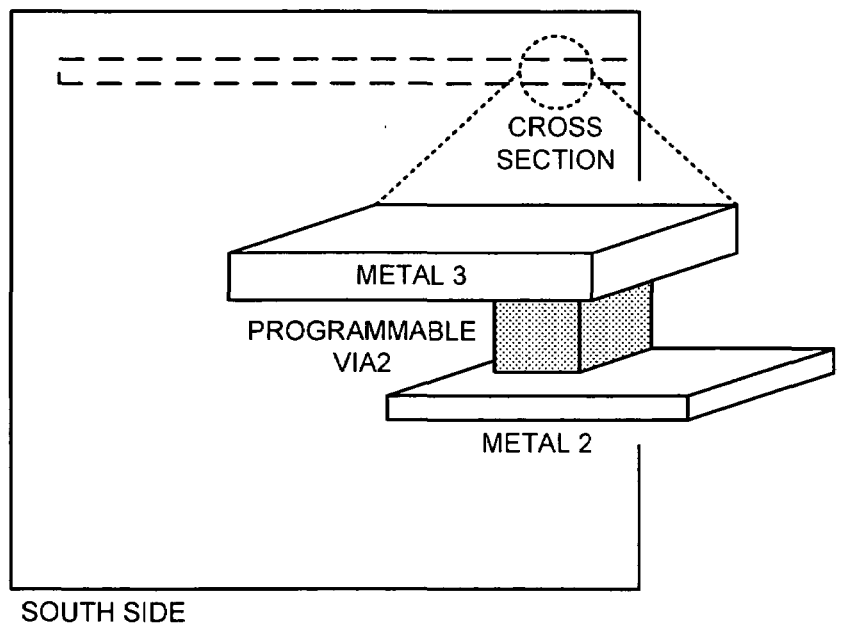
FIG. 3 illustrates a programmable connection to a neighboring cell in accordance with an embodiment of the invention.

FIG. 3 shows an example of how a metal 3 segment can be extended to the cell on the right. We provide metal 2 segments that connect to neighbors by abutment. Hence, a signal that needs to propagate to the right requires a programmable via2 in the current cell and a similar via in the neighbor cell. Within a cell, we reserve a fixed number of metal 3 and metal 4 segments for routing within the cell. These are utilized to connect signals reaching the cell to the appropriate pin. For a crossbar architecture, a safe number to use is the number of active pins. The remaining segments are available for routing signals through a cell. Note that managing the number of active pins in a cell is an effective means of controlling local routability. We use this as a constraint during the packing step described below.

Programmable Fabric Design Tools

As can be seen from FIG. 1, we have restricted the extra tool support required to enable an MPF flow to be very minimal.

Language for Programmable Fabric Description

In one embodiment of the invention, we use textual format to describe an MPF cell. During library generation, the logic function information in the description is used to create a set of functions for use in the derived library for synthesis. The language also contains constraints on how multiple instances of elements from the derived library can be packed onto a single MPF cell. This is used in the packing step. Finally, the language contains constructs to describe MPF routing constraints.

In one embodiment of the invention, the MPF router understands three objects: pins, segments, and connections. The interconnect fabric defines the segments. A connection is a mechanism to realize an electrical equivalence between either a pair of pins, a pair of segments, or a pin and a segment.

Library Generation

Library generation involves enumerating all distinct (equivalent up to the permutation of inputs) functions of the programmable logic function. In addition, a sequential cell that models the circuit in the MPF cell is also added.

Packing

The packing operation involves multiple steps. Each of these steps ensures that the active pin count in an MPF cell does not exceed a user-specified threshold. This is implicit in the graph constructions described below.

We first merge each sequential cell with either a cell driving it or a cell driven by it. We formulate this as a graph-matching problem on a graph derived from the connectivity of the netlist. Each sequential cell and its immediate combinational fanin and combinational fanout cells (in the netlist) are nodes in the graph. There is an edge between a sequential cell and each of its combinational fanin and fanout cells. Packing a sequential and a combinational cell can be realized by solving a maximum matching problem on the graph. Since this graph is often sparse and not connected, an optimum graph-matching technique can be used efficiently.

The second step involves packing multiple combinational cells if we have a combinational to sequential ratio exceeding one. We consider packing a combinational cell with one of its immediate combinational fanin or one of its immediate combinational fanout in the netlist. This too can be formulated as a graph-matching problem, wherein each combinational cell forms a node in a graph, and an edge indicates a fanin/fanout relationship in the netlist. Unfortunately, this results in large connected graphs. Consequently, although the optimum matcher finds excellent solutions, it can require a significant amount of computational time. Note that we can resort to a heuristic to solve this problem, which yields an approximate solution (with an observed quality nearly 10% away from the optimum) in a fraction of the runtime.

Finally, we seek to push inversions to be local to a cell. Each independent inverter competes for an unused local inverter in it's fanout cell with other inverters in the fanins of the fanout cell. We create a graph with a node for each inverter in the design (assuming all fanouts of the inverter can accommodate it as a local inverter). An edge exists between two inverters if they have a common immediate fanout cell or if one drives the other. We now solve an instance of a Maximum Independent Set on this graph. The decision problem to check if there is a Maximum Independent Set of size k in a graph is NP-Complete (reducible to Maximum Clique problem on the dual graph). However, it is trivial to devise a heuristic to compute the Maximal Independent Set using node degrees. Furthermore, using randomization, it is possible to find larger sets.

Routing

From the placement information, we build a routing graph for the whole design. The nodes in the graph include pins in the MPF cells and the segments in the interconnect fabric. For each top-level port in the design, we pick a set of "closest" metal segments in the interconnect fabric. The router will connect to one of these segments when it attempts to complete the routing of the net associated with the port. Euclidean distance can be used to drive the measure of nearness to a port. The connections between a pair of segments and a segment and a pin are available from the MPF description. The connections between neighboring cells are inferred from the placement and the MPF description. Note that each connection forms an edge in the routing graph between the pair of objects it connects.

Much like in standard cell routing, MPF routing problem can be broken into multiple steps to manage the complexity. In the first step, we reserve metal segments that can connect to an active pin in the design. This step, called "pin reservation," detects any pins that are orphaned due to a poor cell design. Also, the mechanism of reserving a segment for a pin prevents nets other than the one connected to the pin from using the segment. This ensures that the pin is not orphaned due to poor detailed routing (due to its sequential nature in processing nets).

Global routing is carried out in a similar manner to standard cells. We can use each MPF cell as the granularity of coarseness during global routing. Thus, the detail router is only restricted to routing within an MPF cell. During global routing, we discount the horizontal and vertical capacities of each MPF cell by the maximum number of active pins. At the end of global routing, we check if an embedding of the global routing into the fabric is possible without any capacity violations. If we find a violation, the solution is to augment the interconnect fabric in the MPF cell by one more routing resource and redo the steps. Once we succeed at this step, the interconnect architecture and the routing process ensures a solution exists after detail routing. In a cross-bar routing architecture, it is easy to ensure that the detail router will not fail, by ensuring that the global routing can be successfully embedded and if that each MPF cell has at least as many horizontal and vertical tracks free as the number of active pins.

Note that we embed the horizontal and vertical segments that span more than one MPF cell using an approach based on track assignment. Finally, detailed routing is carried out on the design, focusing on one MPF cell at a time.

Example Routing Fabric

Figures 4, 5A:
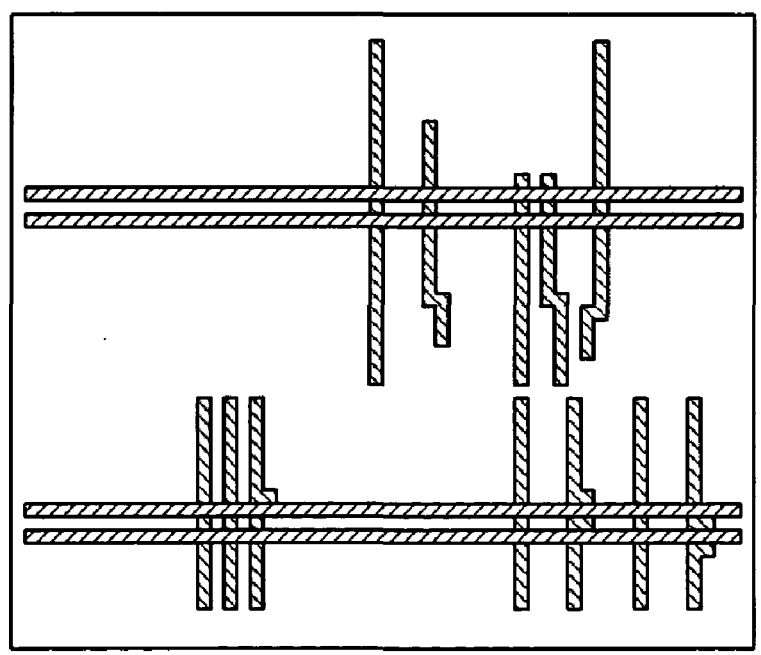
FIG. 4 illustrates a mask-programmable fabric in accordance with an embodiment of the invention.
FIG. 5A illustrates an exemplary metal 2 mask-programmable cell in accordance with an embodiment of the invention.

FIG. 4 presents an exemplary mask-programmable fabric 400 in accordance with an embodiment of the invention. Mask-programmable fabric 400 includes a two-dimensional array of MPF cells 401–412, which can be programmed by modifying vias between metal layers as described above.

Example Cell

Figure 5B:
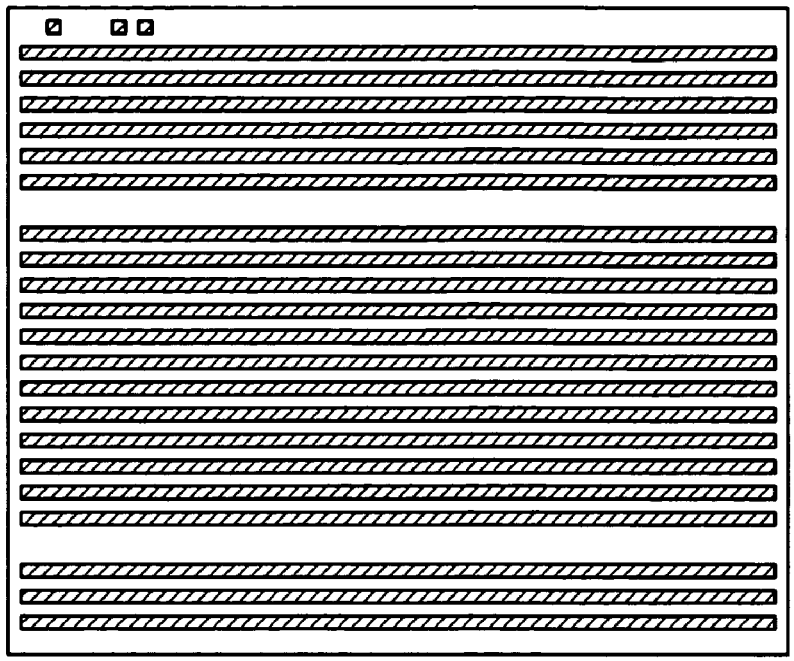
FIG. 5B illustrates metal layer 3 segments for the exemplary mask-programmable cell in accordance with an embodiment of the invention.
Figure 5C:
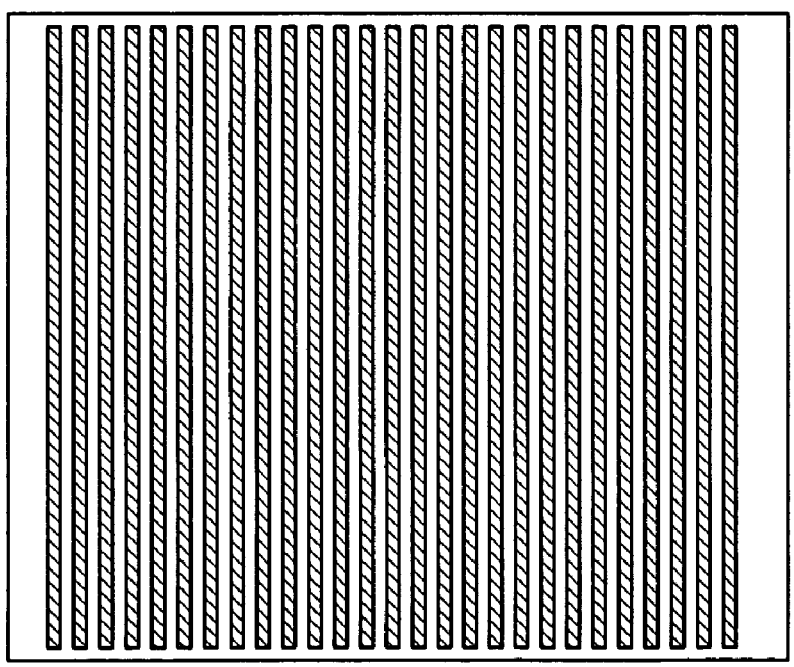
FIG. 5C illustrates metal layer 4 segments for the exemplary mask-programmable cell in accordance with an embodiment of the invention.

FIGS. 5A–5C illustrate the structure of a simple MPF cell. This exemplary cell is architected so that all internal connections are on metal 1, and pins appear as vertical strips on metal 2 as shown in FIG. 5A. The power and ground pins appear on the north and south edges of the cell on metal 1 and are not shown. In addition, we route power and ground on two horizontal metal 3 segments each, which intersect the vertical spans of the pins. This supports logic programming efficiently because each pin can be easily tied to power or ground by means of a via from metal 2 to metal 3. Moreover, note that each pin can connect to a horizontal metal 3 segment that intersects its vertical span for routing.

In this example, the metal 3 and metal 4 routing fabric is comprised of metal segments and is shown in FIG. 5B and FIG. 5C, respectively. Note that four segments on metal 3 are reserved for power and ground. Hence, they are unavailable for interconnect routing.

Metal 5 segments are created similarly to metal 3. However, unlike in the case of metal 3, all segments on metal 5 are available for interconnect routing. A metal 3 segment can connect to a vertical metal 4 segment with a via for interconnect purposes. Similarly, a connection between metal 4 and metal 5 can be realized through a via.

Connections between neighboring cell can be accomplished by, (1) providing tiny metal segments (called "abutment segments") that connect by abutment between neighbor cells, and (2) connecting metal segments to abutment segments through vias. In this way, a connection between two metal 4 vertical segments in neighboring cells (one cell to the north side of the other) and having the same x coordinate can be realized through two via connections.

Mask-Programmable Module

Figure 6:
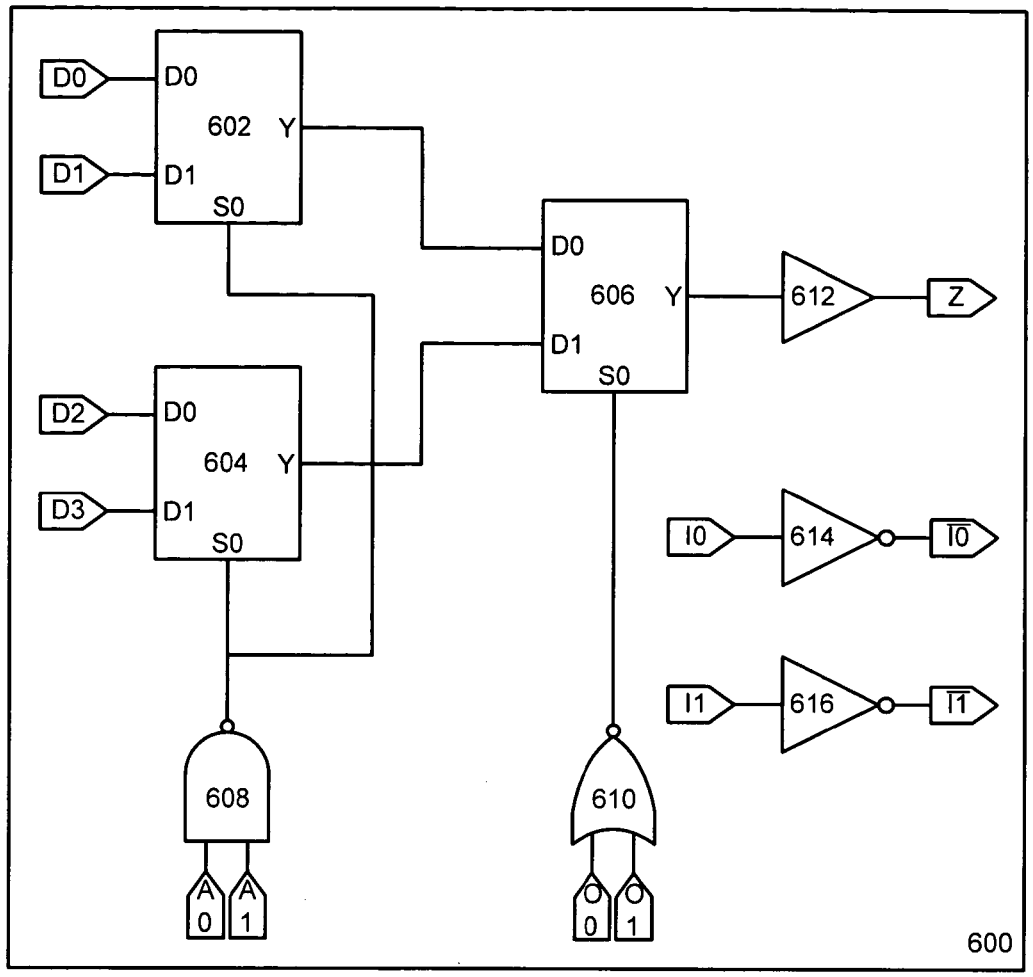
FIG. 6 illustrates an exemplary mask-programmable module in accordance with an embodiment of the invention.

FIG. 6 illustrates an exemplary mask-programmable module 600 in accordance with an embodiment of the invention. Mask-programmable module 600 includes a number of standard cells, including a NAND-gate 608 and a NOR-gate 610, as well as a four-to-one multiplexer (MUX) comprising smaller two-to-one MUXs 602, 604, and 606 and driver 612. Mask-programmable module 600 also includes two free inverters 614 and 616.

NAND-gate 608, NOR-gate 610, MUXs 602, 604, and 606, driver 612, and inverters 614 and 616 were selected from a standard cell library (not shown) and are combined and connected to form mask-programmable module 600 as illustrated in FIG. 6. After combining the standard cells into mask-programmable module 600, and after creating views of mask-programmable module 600, mask-programmable module 600 is added to the standard cell library where it is available for use in building a system.

Creating a Mask-programmable Module

Figure 7:
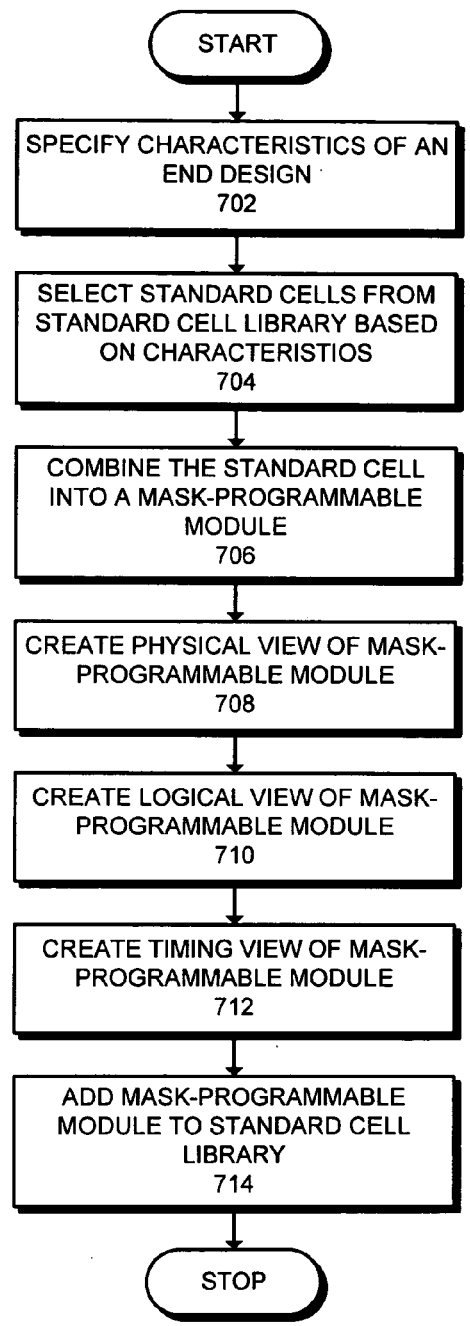
FIG. 7 presents a flowchart illustrating the process of creating a mask-programmable module in accordance with an embodiment of the invention.

FIG. 7 presents a flowchart illustrating the process of creating a mask-programmable module in accordance with an embodiment of the invention. The process starts by specifying (or otherwise receiving) characteristics of an end design (step 702). For example, the end design might be MUX-intensive, might require sequential logic, or might require XOR or XNOR functions. Next, the system selects standard cells from a standard cell library based on the characteristics of the end design (step 704). After selecting the standard cells, the system combines the standard cells into a mask-programmable module (step 706). This can involve defining connections within the mask-programmable module, including connections between standard cells and between pins and standard cells.

Next, the system creates a number of views of the mask programmable module. This can involve creating a physical view of the mask-programmable module that specifies connectivity within the mask-programmable module (step 708); creating a logical view of the mask-programmable module that specifies logical relationships between signals in the mask-programmable module (step 710); and creating a timing view of the mask-programmable module that specifies timing relationships within the mask-programmable module (step 712). Note that the views can be generated rather easily by combining pre-existing information about the plurality of the standard cells from the standard cell library to generate the views for the mask-programmable module.

Finally, the mask-programmable module is added to the standard cell library where it is available for use in developing a system based on a mask-programmable fabric (step 714).

The foregoing descriptions of embodiments of the invention have been presented for purposes of illustration and description only. They are not intended to be exhaustive or to limit the invention to the forms disclosed. Accordingly, many modifications and variations will be apparent to practitioners skilled in the art. Additionally, the above disclosure is not intended to limit the invention. The scope of the invention is defined by the appended claims.

What is claimed is:

1. A method for creating a mask-programmable module from standard cells, comprising:
specifying characteristics of an end design;
selecting a plurality of standard cells from a standard cell library based on the characteristics of the end design;
combining the plurality of standard cells into a mask-programmable module, wherein instances of the mask-programmable module are repeated to form a mask-programmable fabric; and
designing a mask-programmable interconnect to match the mask-programmable module, whereby connections within the mask-programmable module and between mask-programmable modules are generated by programming the mask-programmable interconnect.

2. The method of claim 1, wherein the mask-programmable modules and the mask-programmable interconnect that make up the mask-programmable fabric are programmed by changing inter-metal via layers and/or metal layers.

3. The method of claim 1, wherein combining the plurality of standard cells into a mask-programmable module additionally involves defining connections between standards cells within the mask-programmable module.

4. The method of claim 1, further comprising generating views for the mask-programmable module, wherein the views include:
a physical view that specifies connectivity within the mask-programmable module, including connectively with pins in the mask-programmable module;
a logical view that specifies logical relationships between signals in the mask-programmable module; and
a timing view that specifies timing relationships within the mask-programmable module.

5. The method of claim 4, wherein generating the views involves using pre-existing information about the plurality of the standard cells from the standard cell library to generate the views for the mask-programmable module.

6. The method of claim 1, further comprising:
receiving a high-level design for an integrated circuit; and
performing a synthesis operation on the high-level design to generate a netlist for the high-level design that contains references to mask-programmable modules.

7. The method of claim 6, further comprising performing a placement operation and a routing operation on the netlist to produce a layout for the integrated circuit.

8. The method of claim 7, wherein performing the routing operation involves programming the mask-programmable modules and mask-programmable interconnect.

9. A computer-readable storage medium storing instructions that when executed by a computer cause the computer to perform a method for creating a mask-programmable module from standard cells, the method comprising:
   specifying characteristics of an end design;
   selecting a plurality of standard cells from a standard cell library based on the characteristics of the end design;
   combining the plurality of standard cells into a mask-programmable module, wherein instances of the mask-programmable module are repeated to form a mask-programmable fabric; and
   designing a mask-programmable interconnect to match the mask-programmable module, whereby connections within the mask-programmable module and between mask-programmable modules are generated by programming the mask-programmable interconnect.

10. The computer-readable storage medium of claim 9, wherein the mask-programmable modules and the mask-programmable interconnect that make up the mask-programmable fabric are programmed by changing inter-metal via layers and/or metal layers.

11. The computer-readable storage medium of claim 9, wherein combining the plurality of standard cells into a mask-programmable module additionally involves defining connections between standards cells within the mask-programmable module.

12. The computer-readable storage medium of claim 9, wherein the method further comprises generating views for the mask-programmable module, wherein the views include:
   a physical view that specifies connectivity within the mask-programmable module, including connectively with pins in the mask-programmable module;
   a logical view that specifies logical relationships between signals in the mask-programmable module; and
   a timing view that specifies timing relationships within the mask-programmable module.

13. The computer-readable storage medium of claim 12, wherein generating the views involves using pre-existing information about the plurality of the standard cells from the standard cell library to generate the views for the mask-programmable module.

14. The computer-readable storage medium of claim 9, wherein the method further comprises:
   receiving a high-level design for an integrated circuit; and
   performing a synthesis operation on the high-level design to generate a netlist for the high-level design that contains references to mask-programmable modules.

15. The computer-readable storage medium of claim 14, wherein the method further comprises performing a placement operation and a routing operation on the netlist to produce a layout for the integrated circuit.

16. The computer-readable storage medium of claim 15, wherein performing the routing operation involves programming the mask-programmable modules and mask-programmable interconnect.

17. An apparatus for creating a mask-programmable module from standard cells, comprising:
   a specifying mechanism configured to specify characteristics of an end design;
   a selecting mechanism configured to select a plurality of standard cells from a standard cell library based on the characteristics of the end design;
   a combining mechanism configured to combine the plurality of standard cells into a mask-programmable module, wherein instances of the mask-programmable module are repeated to form a mask-programmable fabric; and
   a designing mechanism configured to design a mask-programmable interconnect to match the mask-programmable module, whereby connections within the mask-programmable module and between mask-programmable modules are generated by programming the mask-programmable interconnect.

18. The apparatus of claim 17, wherein functions of the mask-programmable modules and the mask-programmable interconnect that make up the mask-programmable fabric are programmed by changing inter-metal via layers and/or metal layers.

19. The apparatus of claim 17, wherein combining the plurality of standard cells into a mask-programmable module additionally involves defining connections between standards cells within the mask-programmable module.

20. The apparatus of claim 17, further comprising a generating mechanism configured to generate views for the mask-programmable module, wherein the views include:
   a physical view that specifies connectivity within the mask-programmable module, including connectively with pins in the mask-programmable module;
   a logical view that specifies logical relationships between signals in the mask-programmable module; and
   a timing view that specifies timing relationships within the mask-programmable module.

21. The apparatus of claim 20, wherein generating the views involves using pre-existing information about the plurality of the standard cells from the standard cell library to generate the views for the mask-programmable module.

22. The apparatus of claim 17, further comprising:
   a receiving mechanism configured to receive a high-level design for an integrated circuit; and
   a synthesis mechanism configured to perform a synthesis operation on the high-level design to generate a netlist for the high-level design that contains references to mask-programmable modules.

23. The apparatus of claim 22, further comprising a place-and-route mechanism configured to perform a placement operation and a routing operation on the netlist to produce a layout for the integrated circuit.

24. The apparatus of claim 23, wherein performing the routing operation involves programming the mask-programmable modules and mask-programmable interconnect.

* * * * *